(12) United States Patent
Wang et al.

(10) Patent No.: US 11,747,419 B2
(45) Date of Patent: Sep. 5, 2023

(54) SYSTEMS AND METHODS FOR SPIRAL-IN-OUT LOW FIELD MRI SCANS

(71) Applicant: University of Virginia Patent Foundation, Charlottesville, VA (US)

(72) Inventors: Zhixing Wang, Charlottesville, VA (US); Xue Feng, Zion Crossroads, VA (US); John P. Mugler, III, Charlottesville, VA (US); Michael Salerno, Charlottesville, VA (US); Adrienne E. Campbell-Washburn, Charlottesville, VA (US); Craig H. Meyer, Charlottesville, VA (US)

(73) Assignee: University of Virginia Patent Foundation, Charlottesville, VA (US)

(*) Notice: Subject to any disclaimer, the term of this patent is extended or adjusted under 35 U.S.C. 154(b) by 0 days.

(21) Appl. No.: 17/733,970

(22) Filed: Apr. 29, 2022

(65) Prior Publication Data
US 2022/0349970 A1 Nov. 3, 2022

Related U.S. Application Data

(60) Provisional application No. 63/181,537, filed on Apr. 29, 2021.

(51) Int. Cl.
*G01R 33/48* (2006.01)
*G01R 33/561* (2006.01)
(Continued)

(52) U.S. Cl.
CPC ....... *G01R 33/4818* (2013.01); *G01R 33/448* (2013.01); *G01R 33/543* (2013.01); *G01R 33/5613* (2013.01); *G01R 33/56518* (2013.01)

(58) Field of Classification Search
CPC ............ G01R 33/4818; G01R 33/448; G01R 33/543; G01R 33/5613; G01R 33/56518;
(Continued)

(56) References Cited

U.S. PATENT DOCUMENTS

2006/0214660 A1* 9/2006 Lustig ............... G01R 33/5613
324/309
2013/0251227 A1* 9/2013 Wang .................. G01R 33/246
324/309

(Continued)

*Primary Examiner* — G.M. A Hyder
(74) *Attorney, Agent, or Firm* — Meunier Carlin & Curfman LLC

(57) ABSTRACT

Systems and methods for performing ungated magnetic resonance imaging are disclosed herein. A method includes producing magnetic resonance image MRI data by scanning a target in a low magnetic field with a pulse sequence having a spiral trajectory; sampling k-space data from respective scans in the low magnetic field and receiving at least one field map data acquisition and a series of MRI data acquisitions from the respective scans; forming a field map and multiple sensitivity maps in image space from the field map data acquisition; forming target k-space data with the series of MRI data acquisitions; forming initial magnetic resonance images in the image domain by applying a Non-Uniform Fast Fourier Transform to the target k-space data; and forming reconstructed images with a low rank plus sparse (L+S) reconstruction algorithm applied to the initial magnetic resonance images.

20 Claims, 14 Drawing Sheets

(51) Int. Cl.
  *G01R 33/44* (2006.01)
  *G01R 33/565* (2006.01)
  *G01R 33/54* (2006.01)

(58) Field of Classification Search
  CPC .......... G01R 33/56563; G01R 33/5611; G01R 33/56325; G01R 33/445; G01R 33/4824; G01R 33/5614
  See application file for complete search history.

(56) References Cited

U.S. PATENT DOCUMENTS

2019/0154785 A1\* 5/2019 Zhou ...................... A61B 5/055
2020/0363485 A1\* 11/2020 Sun ...................... G01R 33/567
2022/0222781 A1\* 7/2022 Jacob ...................... G06N 3/084

\* cited by examiner

300

302
Produce magnetic resonance imaging (MRI) data corresponding to a target by scanning the target in a low magnetic field with a pulse sequence having a spiral trajectory

304
Form k-space data from respective scans in the low magnetic field and receiving at least one field map data acquisition and a series of MRI data acquisitions from the respective scans

306
Form a field map and a sensitivity map in image space from the field map data acquisition

308
Form target k-space data with the series of MRI data acquisitions

310
Form initial magnetic resonance images in the image domain by applying a Non-Uniform Fast Fourier Transform to the target k-space data

312
Form reconstructed images with a low rank plus sparse (L + S) reconstruction algorithm applied to the initial magnetic resonance images

*FIG. 3*

| Sequence | TR/TE (ms) | FA | GA | Spiral Density | TRs per frame | Resolution | |
|---|---|---|---|---|---|---|---|
| | | | | | | Spatial (mm²) | Temporal (ms) |
| Spiral-in/out RT CINE | 6/3 | 60° | 32.04° | 0.32x – 0.09x | 6 | 1.7 × 1.7 | 36 |
| Cartesian CINE | 3.58/1.79 | 60° | - | - | 108 | 1.5 × 1.5 | 33 |

FIG. 5

SYSTEMS AND METHODS FOR SPIRAL-IN-OUT LOW FIELD MRI SCANS

CROSS-REFERENCE TO RELATED APPLICATION

This Application claims priority to and benefit of U.S. Provisional Patent Application Ser. No. 63/181,537 entitled "System and method for spiral-in-out bSSFP real-time cine on a high performance 0.551 scanner" filed Apr. 29, 2021, which is hereby incorporated by reference herein in its entirety as if fully set forth below.

FIELD

The present disclosure relates to systems and methods for a spiral-in-out bSSFP pulse sequence and image reconstruction.

BACKGROUND

Magnetic resonance imaging (MRI) is an important diagnostic tool for various conditions, including brain conditions. Because of the good soft tissue contrast, non-invasiveness and lack of ionizing radiation of MRI, it is widely used as a diagnostic tool for brain conditions including stroke, tumors, multiple sclerosis (MS), hemorrhage, blood vessel issues, and neurodegenerative diseases. A clinical protocol often includes pre- and post-contrast T1, T2, fluid-attenuated inversion recovery (FLAIR), proton density (PD) and diffusion weighted images (DWI). Other advanced sequences such as magnetic resonance angiography (MRA) and perfusion MRI using dynamic susceptibility contrast (DSC) and arterial spin labelling (ASL) are also used for specific conditions.

Balanced steady-state free procession (bSSFP) is an MRI sequence for assessing cardiac function using cardiac MR, because of its short acquisition time and high blood-myocardium contrast [1]. However, off-resonance phase accrual can produce undesirable banding artifacts in bSSFP, which limits the TR to 3-4 ms at 1.5 T and even shorter at 3 T.

Among other needs, there is a need for methods of low-field MRI imaging. It is with respect to these and other considerations that the various embodiments described below are presented.

SUMMARY

In one aspect, the present disclosure relates to a computer implemented method for ungated magnetic resonance imaging. In one embodiment, the computer implemented method includes producing magnetic resonance imaging (MRI) data corresponding to a target by scanning the target in a low magnetic field with a pulse sequence having a spiral trajectory; sampling k-space data from respective scans in the low magnetic field and receiving at least one field map data acquisition and a series of MRI data acquisitions from the respective scans; forming a field map and a sensitivity map in image space from the field map data acquisition; forming target k-space data with the series of MRI data acquisitions; forming initial magnetic resonance images in the image domain by applying a Non-Uniform Fast Fourier Transform to the target k-space data; and forming reconstructed images with a low rank plus sparse (L+S) reconstruction algorithm applied to the initial magnetic resonance images.

In some embodiments, the method includes sampling k-space data includes sampling a continuous series of the respective scans, each scan having the at least one field map data acquisition and the series of MRI data acquisitions.

In some embodiments, the respective scans include two field map data acquisitions that are used to form the field map and multiple sensitivity maps in image space.

In some embodiments, the respective scans further include dummy cycles, with a data acquisition window in an off state, to achieve a steady state of magnetization before implementing the MRI data acquisitions with the acquisition window in an on state.

In some embodiments, the respective scans include 100 dummy cycles.

In some embodiments, the dummy cycles occur after the field data acquisition.

In some embodiments, the respective scans with the series of MRI data acquisitions include 384 spiral arms per slice.

In some embodiments, the target is a heart of a patient, and the respective scans cover a period of time between heart beats. a heart cycle.

In some embodiments, the respective scans utilize a tiny golden angle rotation along the time domain to reduce the eddy current effect when alternating the gradient polarity.

In some embodiments, the series of MRI data acquisitions include a variable density spiral-in-out trajectory scan.

In some embodiments, the variable density spiral-in-out scan includes a 4 ms readout length to sample a frame of the target k-space data at positions proximate a center of the frame.

In some embodiments, the variable density spiral-in-out scan reduces coherence of under-sampling aliasing patterns to improve characteristics for the L+S reconstruction algorithm.

In some embodiments, the reconstructed images include corrections for blurring artifacts and aliasing artifacts by modifying the initial images in accordance with the field map, the sensitivity maps and the L+S algorithm.

In some embodiments, the low magnetic field strength is less than 1 Tesla.

In some embodiments, the low magnetic field is 0.55 Tesla.

In some embodiments, the method includes utilizing balanced steady state free precession (bSSFP) sequences in the cardiac imaging.

In some embodiments, the method includes under-sampling target k-space data using a spiral-in-out trajectory.

In some embodiments, the method includes under-sampling by a factor of 8.

In another aspect, the present disclosure relates to a magnetic resonance imaging device configured to produce magnetic resonance imaging (MRI) data corresponding to a target; and one or more processors in data communication with computer memory and the magnetic resonance imaging device, where the one or more processors are configured to cause the system to perform a computer implemented method including: scanning the target in a low magnetic field with a pulse sequence having a spiral trajectory; sampling k-space data from respective scans in the low magnetic field and receiving at least one field map data acquisition and a series of MRI data acquisitions from the respective scans; forming a field map and a sensitivity map in image space from the field map data acquisition; forming target k-space data with the series of MRI data acquisitions; forming initial magnetic resonance images in the image domain by applying a Non-Uniform Fast Fourier Transform to the target k-space data; and forming reconstructed images with a low rank plus sparse (L+S) reconstruction algorithm applied to the initial magnetic resonance images.

In yet another aspect, the present disclosure relates to a non-transitory computer-readable medium having stored instructions that, when executed by one or more processors, cause a magnetic resonance imaging system to perform a computer implemented method that includes: scanning a target in a low magnetic field with a pulse sequence having a spiral trajectory; sampling k-space data from respective scans in the low magnetic field and receiving at least one field map data acquisition and a series of MRI data acquisitions from the respective scans; forming a field map and a sensitivity map in image space from the field map data acquisition; forming target k-space data with the series of MRI data acquisitions; forming initial magnetic resonance images in the image domain by applying a Non-Uniform Fast Fourier Transform to the target k-space data; and forming reconstructed images with a low rank plus sparse (L+S) reconstruction algorithm applied to the initial magnetic resonance images.

Other aspects and features according to the example embodiments of the present disclosure will become apparent to those of ordinary skill in the art, upon reviewing the following detailed description in conjunction with the accompanying figures.

BRIEF DESCRIPTION OF THE DRAWINGS

Reference will now be made to the accompanying drawings, which are not necessarily drawn to scale.

FIG. 3 illustrates a method for performing ungated magnetic resonance imaging, according to one embodiment of the present disclosure.

FIG. 4A illustrates a pulse sequence diagram showing a sampling strategy with the field map acquisition, dummy scan and dynamic data acquisition. FIG. 4B illustrates the field map and sensitivity maps estimated using the fully-sampled center k-space data collected from the field map acquisition. FIG. 4C illustrates spiral-in-out bSSFP pulse sequences with an under sampling rate of 8 were evaluated in this study using different image reconstruction methods.

FIG. 5 illustrates a table of sequence parameters for spiral-in-out RT cine and Cartesian cine according to an example embodiment of the present disclosure.

FIG. 6A shows short-axis images and FIG. 6B shows long axis images.

FIG. 7A illustrates short axis images, and FIG. 7B illustrates long axis images.

FIG. 9A illustrates an example of poor ECG triggering, FIG. 9B illustrates a comparison of a poor breath hold with a successful breath hold.

DETAILED DESCRIPTION

Figure 1:
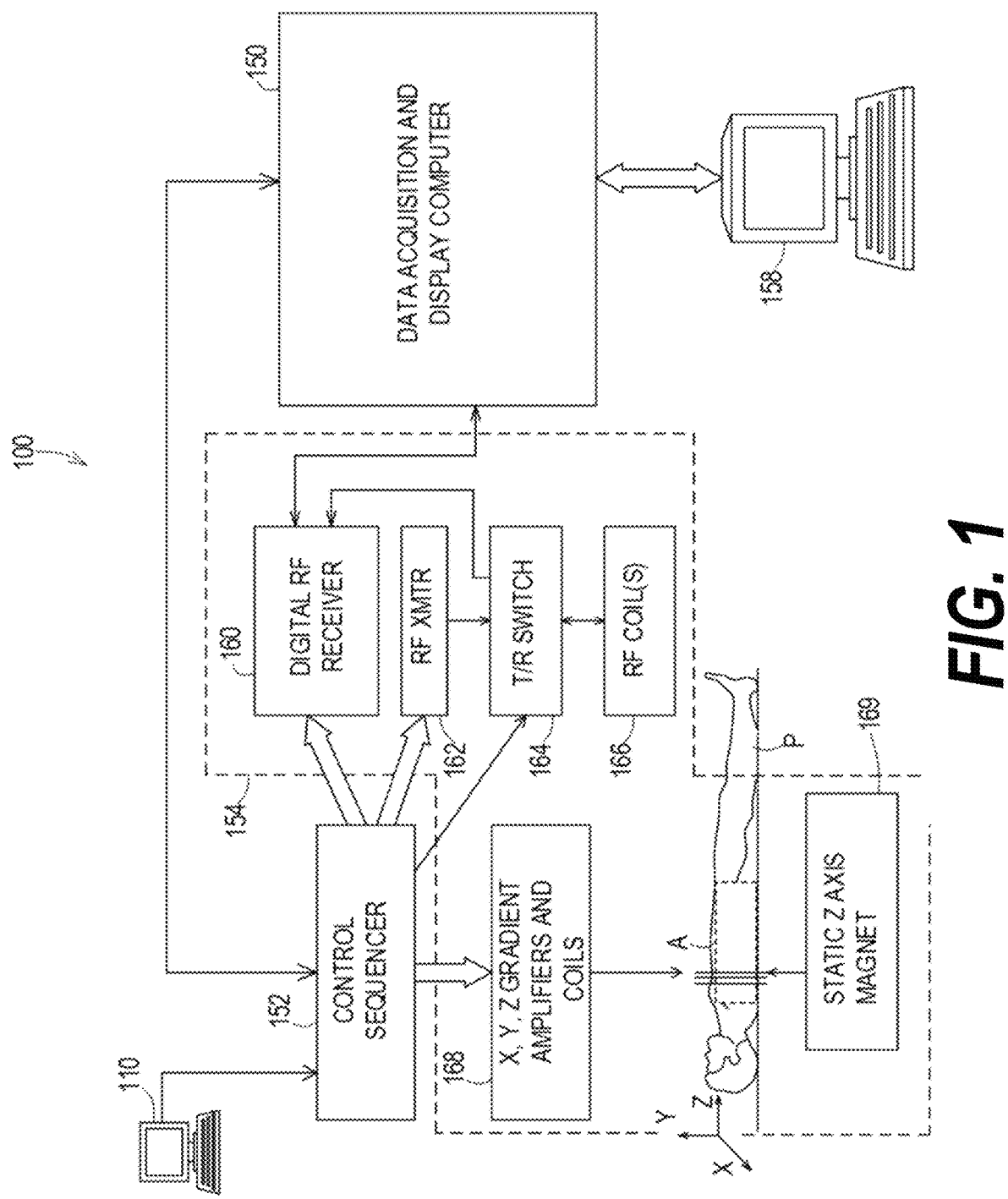
FIG. 1 is a system diagram illustrating an operating environment capable of implementing aspects of the present disclosure.

Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some claims may refer to a "heart cycle" which is generally a term of art that means, to most people, the R-R interval, which is the interval between two consecutive R waves of an electrocardiogram (ECG).

Some references, which may include various patents, patent applications, and publications, are cited in reference lists and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. For example, "[3]" refers to the 3$^{rd}$ reference in the list, namely Rashid S. Han F. Gao Y. Sung K. Cao M. Yang Y. Hu P. Cardiac Balanced steady-state free precession MRI at 0.35 T: a comparison study with 1.5 T. Quantitative Imaging in Medicine and Surgery. 2017; 8(7):627-636. All references cited and discussed in this specification are incorporated herein by reference in their entireties and to the same extent as if each reference was individually incorporated by reference.

A detailed description of aspects of the present disclosure, in accordance with various example embodiments, will now be provided with reference to the accompanying drawings. The drawings form a part hereof and show, by way of illustration, specific embodiments and examples. In referring to the drawings, like numerals represent like elements throughout the several figures. Some experimental data are presented herein for purposes of illustration and should not be construed as limiting the scope of the present disclosure in any way or excluding any alternative or additional embodiments.

FIG. 1 is a system diagram illustrating an operating environment capable of implementing aspects of the present disclosure in accordance with one or more example embodiments. FIG. 1 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158. The display 158 may be implemented through a variety of output interfaces, including a monitor, printer, or data storage.

The area of interest "A" corresponds to a region associated with one or more physiological activities in patient "P". The area of interest shown in the example embodiment of FIG. 1 corresponds to a chest region of patient "P", but the area of interest for purposes of implementing aspects of the disclosure presented herein is not limited to the chest area. It should be recognized and appreciated that the area of interest can be one or more of a brain region, heart region, and upper or lower limb regions of the patient "P", for example.

It should be appreciated that any number and type of computer-based medical imaging systems or components, including various types of commercially available medical imaging systems and components, may be used to practice certain aspects of the present disclosure. Systems as described herein with respect to example embodiments are not intended to be specifically limited to magnetic resonance imaging (MRI) implementations or the particular system shown in FIG. 1.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

Figure 2:
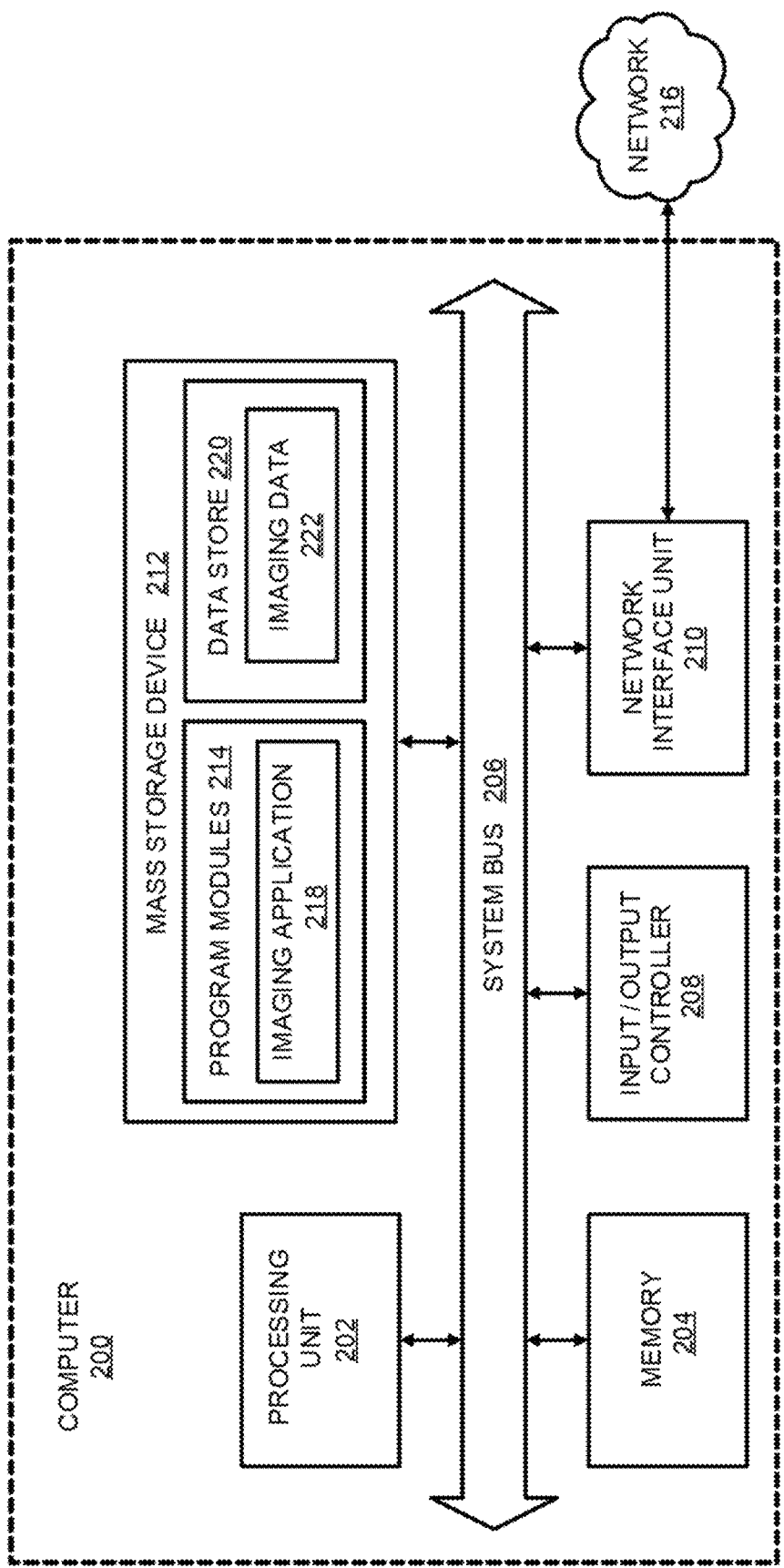
FIG. 2 is a computer architecture diagram showing a general computing system capable of implementing aspects of the present disclosure.

FIG. 2 is a computer architecture diagram showing a general computing system capable of implementing aspects of the present disclosure in accordance with one or more embodiments described herein. A computer 200 may be configured to perform one or more functions associated with embodiments of this disclosure. For example, the computer 200 may be configured to perform operations for denoising MR images as described herein with respect to certain embodiments. It should be appreciated that the computer 200 may be implemented within a single computing device or a computing system formed with multiple connected computing devices. The computer 200 may be configured to perform various distributed computing tasks, which may distribute processing and/or storage resources among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform one or more functions associated with embodiments of method as illustrated in one or more of the figures of this disclosure, for example to cause the computer 200 to perform operations of the present disclosure as described below. The program modules 214 may include an imaging application 218 for performing data acquisition functions as described herein, for example to receive image data corresponding to magnetic resonance imaging of an area of interest. The computer 200 can include a data store 220 for storing data that may include imaging-related data 222 such as acquired image data, and a modeling data store 224 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media (also referred to herein as a "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. Transitory signals are not "computer-storage media", "computer-readable storage medium" or "computer-readable storage media" as described herein.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency network, a Bluetooth-enabled network, a Wi-Fi enabled network, a satellite-based network, or other wired and/or wireless networks for communication with external devices and/or systems. The computer 200 may also include an input/output controller 208 for receiving and processing input from a number of input devices. Input devices may include one or more of keyboards, mice, stylus, touchscreens, microphones, audio capturing devices, or image/video capturing devices. An end user may utilize such input devices to interact with a user interface, for example a graphical user interface, for managing various functions performed by the computer 200.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer-storage media may also represent secondary storage, whether implemented as hard drives or otherwise. Hard drive implementations may be characterized as solid state or may include rotating media storing magnetically-encoded information. The program modules 214, which include the imaging application 218, may include instructions that, when loaded into the processing unit 202 and executed, cause the computer 200 to provide functions associated with embodiments illustrated herein. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

Commercially available medical imaging systems and components, may be used to practice certain aspects of the present disclosure. These commercially available imaging systems include 0.55 T scanners, including high performance 0.55 T scanners.

With reference to FIG. 3, embodiments of the present disclosure relate to computer implemented methods of performing ungated MRI. FIG. 3 illustrates a method of performing ungated MRI according to one embodiment of the present disclosure.

At step 302, MRI data is produced corresponding to a target by scanning the target in a magnetic field. The magnetic field can be a low magnetic field with a pulse sequence having a spiral trajectory. A non-limiting example of low magnetic field can be a 0.55 Tesla magnetic field. However, it should be understood that some embodiments of the present disclosure can include performing MRI imaging at a low magnetic field field of 1 Tesla or less. And, another non-limiting example of a low magnetic field for MRI imaging is a 0.064 Tesla field.

As an example, the MRI data can be obtained using the system illustrated in FIG. 1. The target can correspond to a patient P or the area of interest A illustrated in FIG. 1. As a non-limiting example, the subject can be the heart of a patient P. In some embodiments of the present disclosure, the heart of the patient P can be the area of interest A.

Additionally, in some embodiments of the present disclosure the imaging can be performed using a balanced steady state free precession (bSSFP) sequence. As another non-limiting example, if the target is the heart of patient P illustrated in FIG. 1, the imaging can be bSSFP cardiac imaging.

Step 304 includes sampling k-space data from respective scans in the low magnetic field and receiving at least one field map data acquisition and a series of MRI data acquisitions from the respective scans. In some embodiments of the present disclosure, sampling k-space data can include sampling a continuous series of the respective scans, each scan having the at least one field map data acquisition and the series of MRI data acquisitions. Additionally, the present disclosure contemplates that the MRI data produced at step 302 can be acquired over a period of time. For example, the MRI data can be acquired over a heart cycle, or a period of time between heart beats. Additionally, in some embodiments of the present disclosure, the respective scans can utilize a tiny golden angle rotation along the time domain. The tiny golden angle rotation along the time domain can reduce the eddy current effect when alternating the gradient polarity. Additionally, in some embodiments of the present disclosure, the series of MRI data acquisitions can include a variable density spiral-in-out trajectory scan. As a non-limiting example, the variable density spiral-in-out scan can include a 4 ms readout length to sample a frame of the target k-space data at positions proximate a center of the frame. As another non-limiting example, the variable density spiral-in-out scan can reduce coherence of under-sampling aliasing patterns to improve characteristics for the L+S reconstruction algorithm.

In some embodiments of the present disclosure, the method can include under-sampling the target k-space data using a spiral-in-out trajectory. As another non-limiting example, the under sampling can be under sampling by a factor of 8.

In some embodiments of the present disclosure, the respective scans comprise two field map data acquisitions that are used to form the field map and multiple sensitivity maps in image space. Additionally, in some embodiments of the present disclosure, respective scans further comprise dummy cycles, with a data acquisition window in an off state, to achieve a steady state of magnetization before implementing the MRI data acquisitions with the acquisition window in an on state. As a non-limiting example, the respective scans can include 100 dummy cycles. As another non-limiting example, the respective scans with the series of MRI data acquisitions can include 384 spiral arms per slice.

Step 306 includes forming a field map and a sensitivity map in image space from the field map data acquisition. In some embodiments, multiple sensitivity maps are formed in image space from the field map data acquisition.

Step 308 includes forming target k-space data with the series of MRI data acquisitions.

Step 310 includes forming initial magnetic resonance images in the image domain by applying a Non-Uniform Fast Fourier Transform and gridding the target k-space data; and Step 312 includes forming reconstructed images with a low rank plus sparse (L+S) reconstruction algorithm applied to the initial magnetic resonance images. The reconstructed images can include corrections for blurring artifacts and/or aliasing artifacts. The reconstructed images can be corrected for blurring artifacts and/or aliasing artifacts by modifying the initial images in accordance with the field map, the sensitivity map(s) and the L+S algorithm.

It should be understood that the method 300 can be implemented as a computer implemented method, for example using the general computing system illustrated in FIG. 2. Moreover, it should be understood that the method 300 can be a computer implemented method for operating a system, e.g. the system illustrated in FIG. 1.

EXAMPLE 1

Spiral-in-out bSSFP Real-Time Cine on a High Performance 0.55 T Scanner

Some embodiments of the present disclosure include a spiral-in-out bSSFP pulse sequence combined with a low rank plus sparse (L+S) image reconstruction for ungated real-time cine on a high performance 0.55 T MRI scanner. The example embodiment described herein can be used for real-time cardiac imaging with high image quality and excellent temporal resolution.

Low field MRI can include a more homogeneous B0 field when compared to some 1.5 T or 3 T scanners, which can extend the TR to 6~8 ms to improve sampling efficiency [2-5]. Therefore, low field can offer great advantages for SNR-efficient acquisitions such as spiral and EPI trajectories with a longer readout in cardiac imaging [4,5].

Spiral-out and spiral-in-out bSSFP sequences can be used for accelerated real-time cardiac MRI at 1.5 T [6,7]. A spiral-in-out bSSFP sequence combined with a L+S reconstruction [8] can yield ungated cardiac movies with high image quality and minimal temporal blurring, and can be an alternative to gated and breath-held CINE for the assessment of cardiac function. This non-limiting example embodiment includes a spiral-in/out sequence with an extended TR to acquire real-time spiral cine at 0.55 T with high temporal resolution (~36 ms) and spatial resolution (~1.7 mm) within three seconds.

Figure 4A:
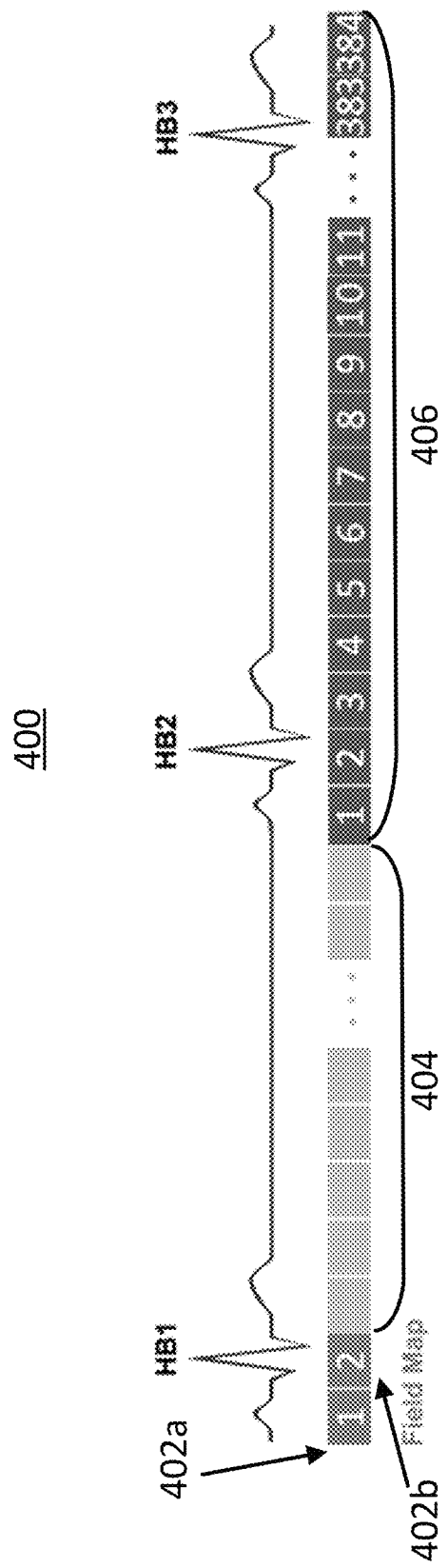
FIGS. 4A-4C illustrate a method and results according to an example embodiment of the present disclosure.

Methods: A schematic of a method 400 according to an example embodiment of the present disclosure is depicted in FIG. 4A. The first two single-shot spirals 402a 402b can be fully sampled before the bSSFP acquisition for field map and coil sensitivity map estimation using ESPIRiT9. A dummy scan 404 with 100 TRs can be used (yellow boxes) in order to approach steady state magnetization. Immediately after the pre-scan, dynamic data with a total of 384 spiral arms per slice was collected using a tiny golden angle rotation, illustrated as the data collection boxes 406. Six spiral-in/out readouts with linearly decreasing sampling density were utilized in this example embodiment to reconstruct each cardiac frame with an under sampling rate of 8. The k-space data is gridded as an initial MRI image, which is essentially an early guess of the reconstructed image. A view-sharing method and a low rank plus sparse (L+S) algorithm were both used for full image reconstruction. The regularization parameters $\lambda_L$ and $\lambda_S$ were set to 0.05 and 0.001, respectively. FOV was set to 340×340 $mm^2$, and TR was set to 6 ms with a readout length of 4 ms.

Figure 4B:
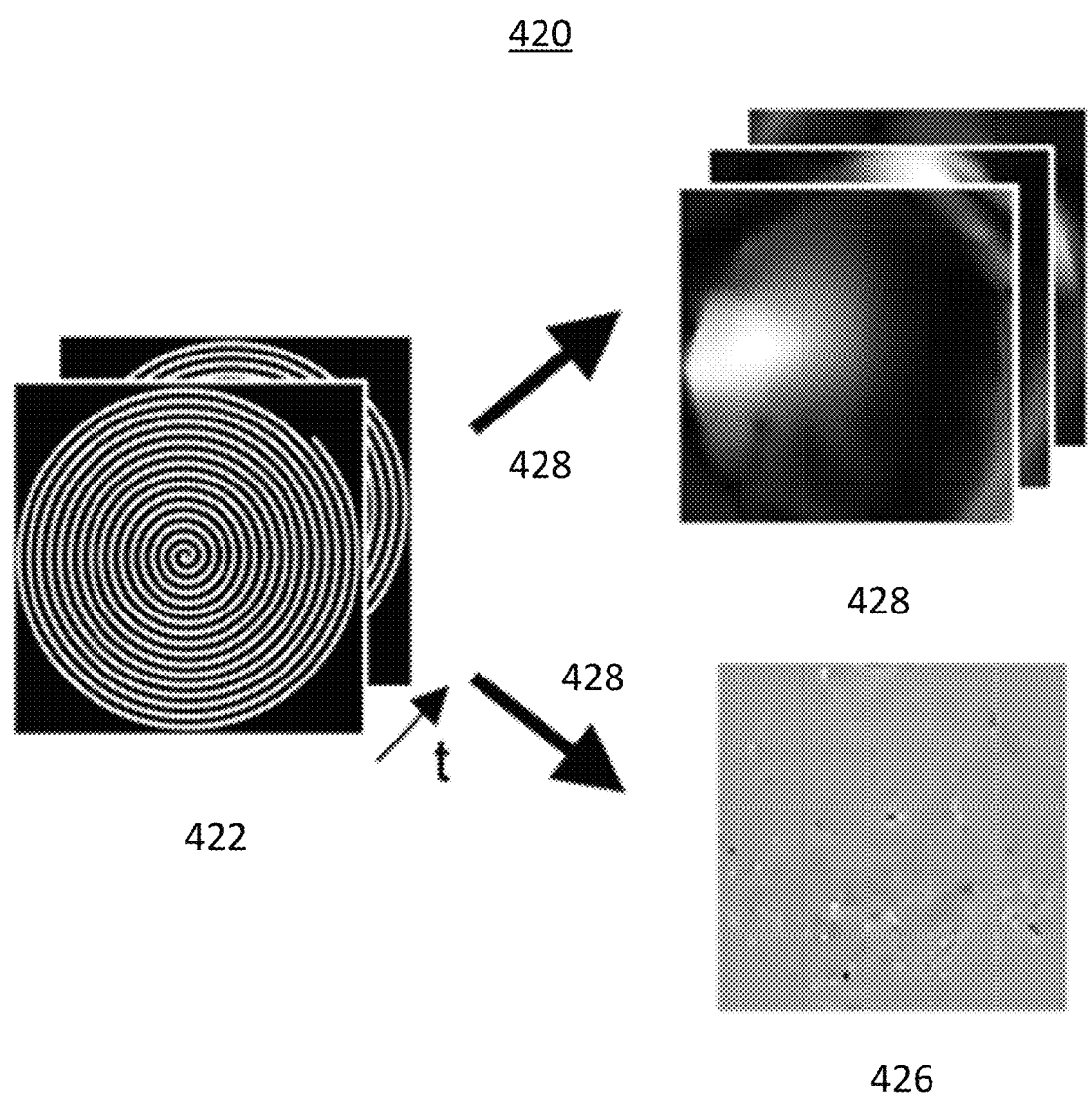

FIG. 4B illustrates a method 420 of estimating the field maps and sensitivity maps. The method uses K-space data 422 to estimate 424 the field map 426 and sensitivity map 428 using the fully sampled center k-space data 422 collected from the acquisition of the field map 426. Other non-limiting examples of sequence parameters and the resulting spatial and temporal resolutions are given in FIG. 5.

Figure 4C:
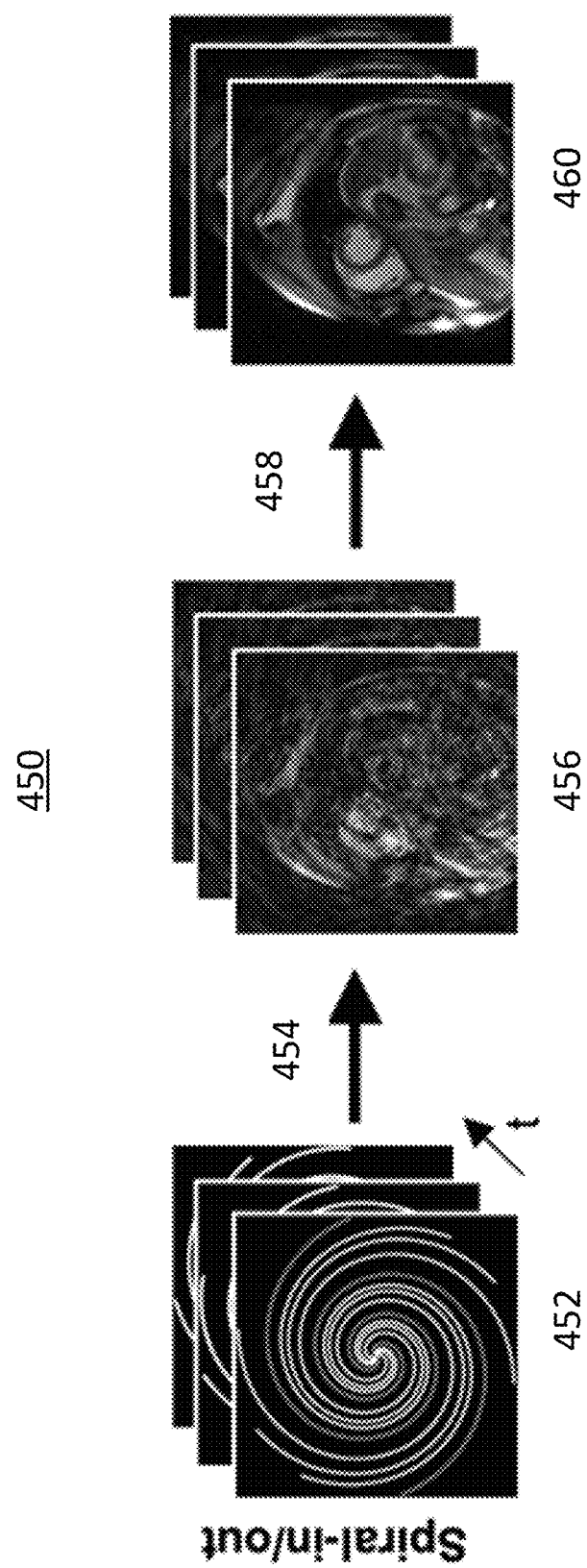

FIG. 4C illustrates a method 450 of performing spiral-in-out bSSFP pulse sequences with an undersampling rate of 8 according to a non-limiting example embodiment of the present disclosure. The k space data 452 can be processed with a nonuniform fast Fourier transform (NUFFT) 454 and gridding in a Cartesian plane to generate initial images 456. The initial images can then be processed using a low-rank plus sparse (L+S) image reconstruction method 458 to create reconstructed images or movies 460.

Experiments were performed to validate an example embodiment of the present disclosure. All of the example experiments were performed on a 0.55 T scanner (prototype MAGNETOM Area, Siemens Healthcare, Erlangen, Germany) with high gradient performance (maximum gradient amplitude=45 mT/m, maximum slew rate=200 T/m/s). For each healthy volunteer, a midventricular short-axis view and a horizontal long-axis view were imaged under breath-held and free-breathing conditions. For each set of experiments, the spiral-in-out bSSFP cine and Cartesian cine were run consecutively at the same image plane.

Figure 6A:
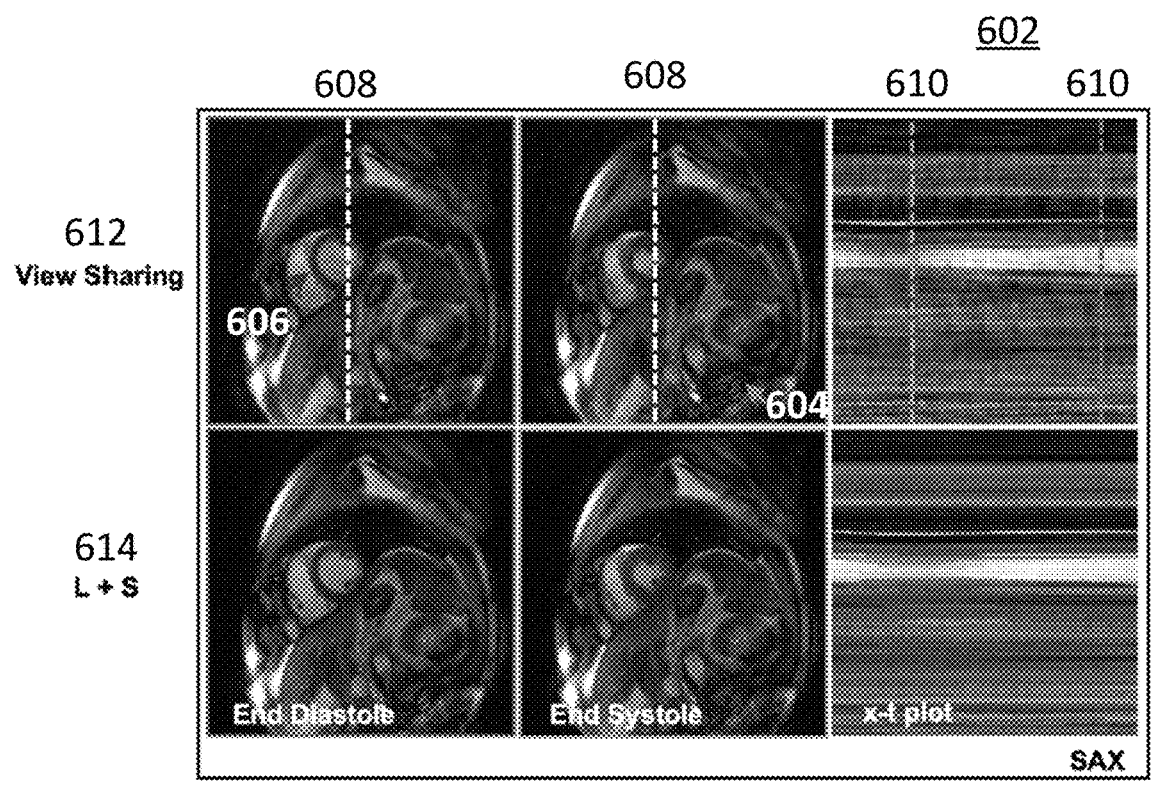
FIGS. 6A-6B illustrate single slice comparisons between two image reconstruction methods: view sharing and low rank plus sparse (L+S).
Figure 6B:
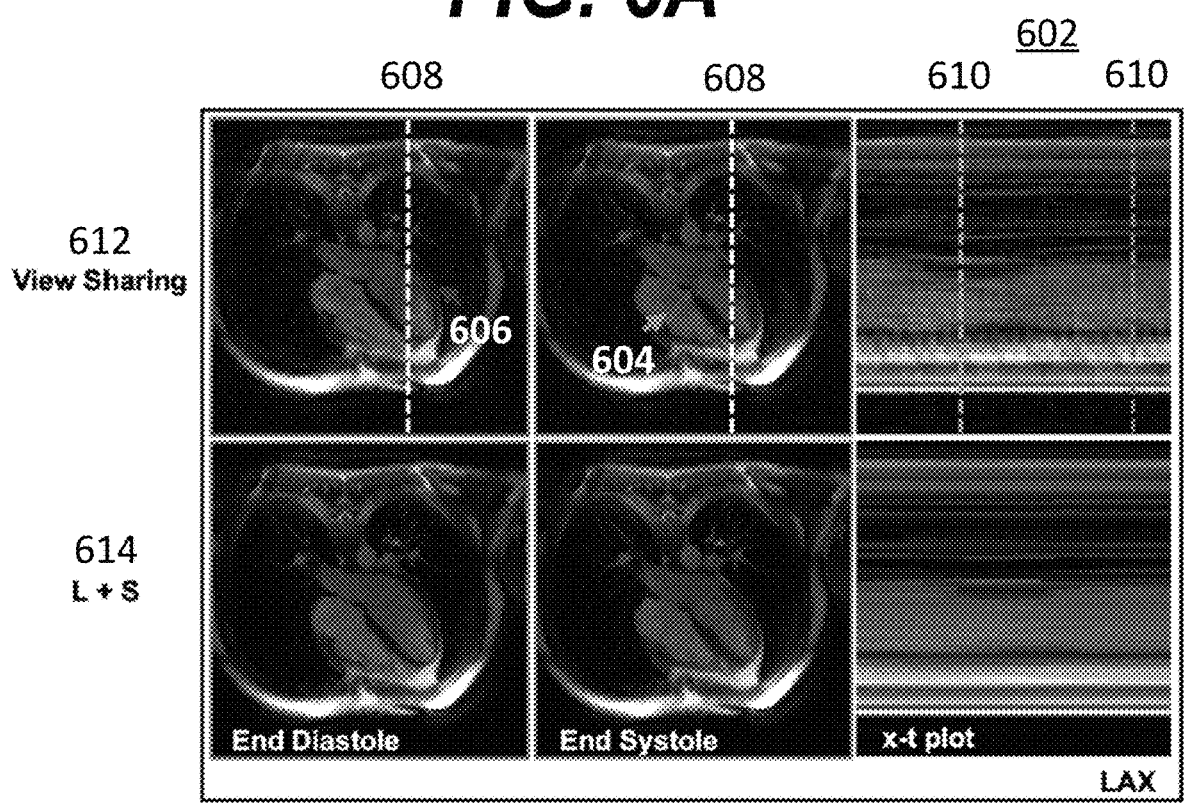
Figure 8:
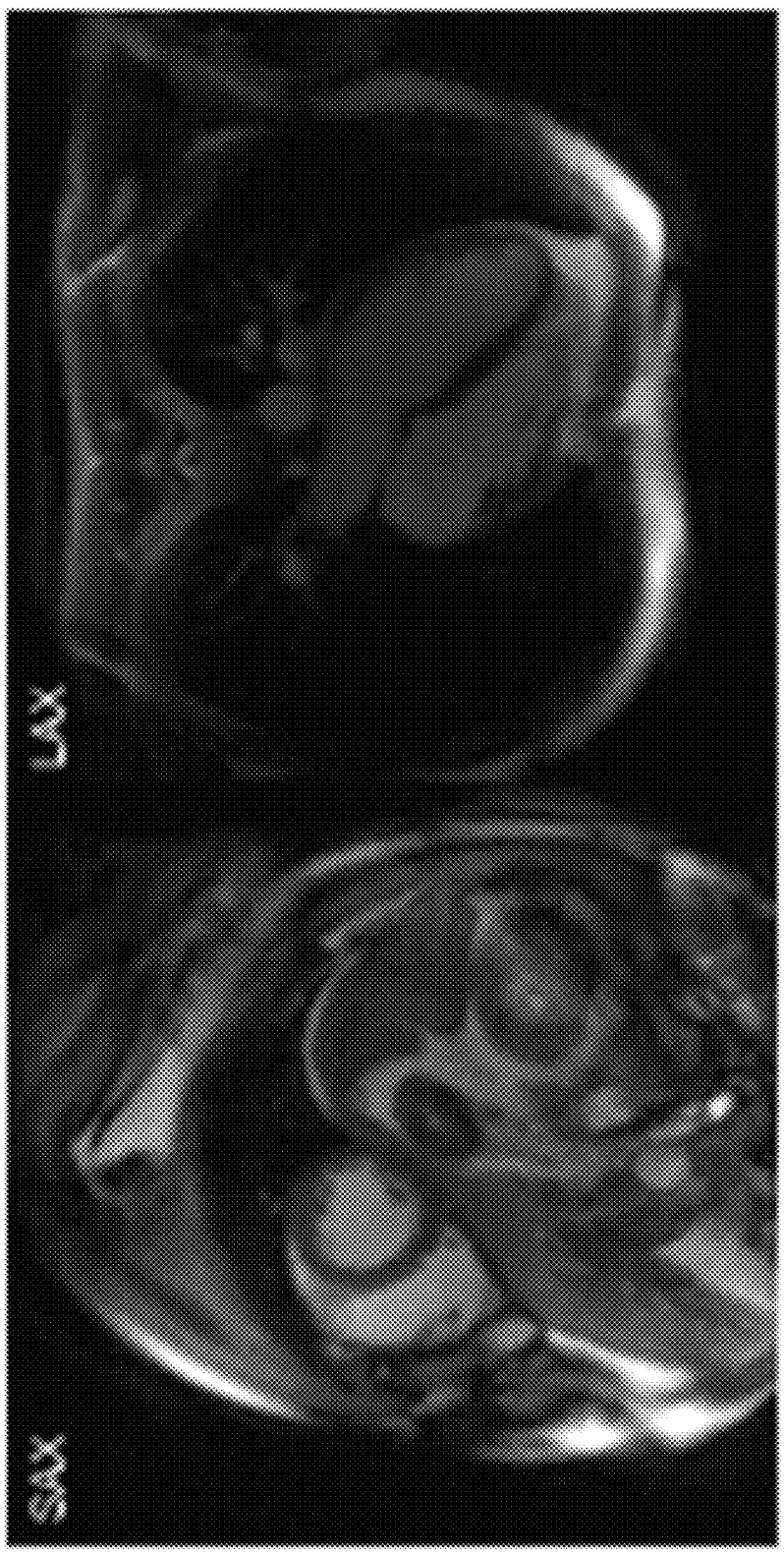
FIG. 8 illustrates an image from a movie from the ungated spiral-in-out bSSFP cine sequence.

Results: FIGS. 6A-6B show systolic and diastolic frames from short-axis and long-axis breath-held experiments using the spiral-in-out bSSFP sequence, where FIG. 6A shows short axis images, and FIG. 6B shows long axis images. Results are shown using view sharing in the top row 612 and L+S reconstruction in the bottom row 614 with the same temporal resolution. The right column 602 shows the temporal profiles across the middle of the left ventricle. The arrows 604 point to structures with view-sharing that show obvious noise-like aliasing artifacts. A second set of arrows 606 point to structures that show temporal blurring. The L+S method performs better in removing aliasing while conserving detailed information with improved image quality. An illustration from a cardiac movie is shown in FIG. 8. The dashed lines 608 shown in FIGS. 6A-6B indicate the location used to derive the x-t profile. A second set of dashed lines 610 indicate end systolic and end diastolic cardiac images, respectively.

Figure 7A:
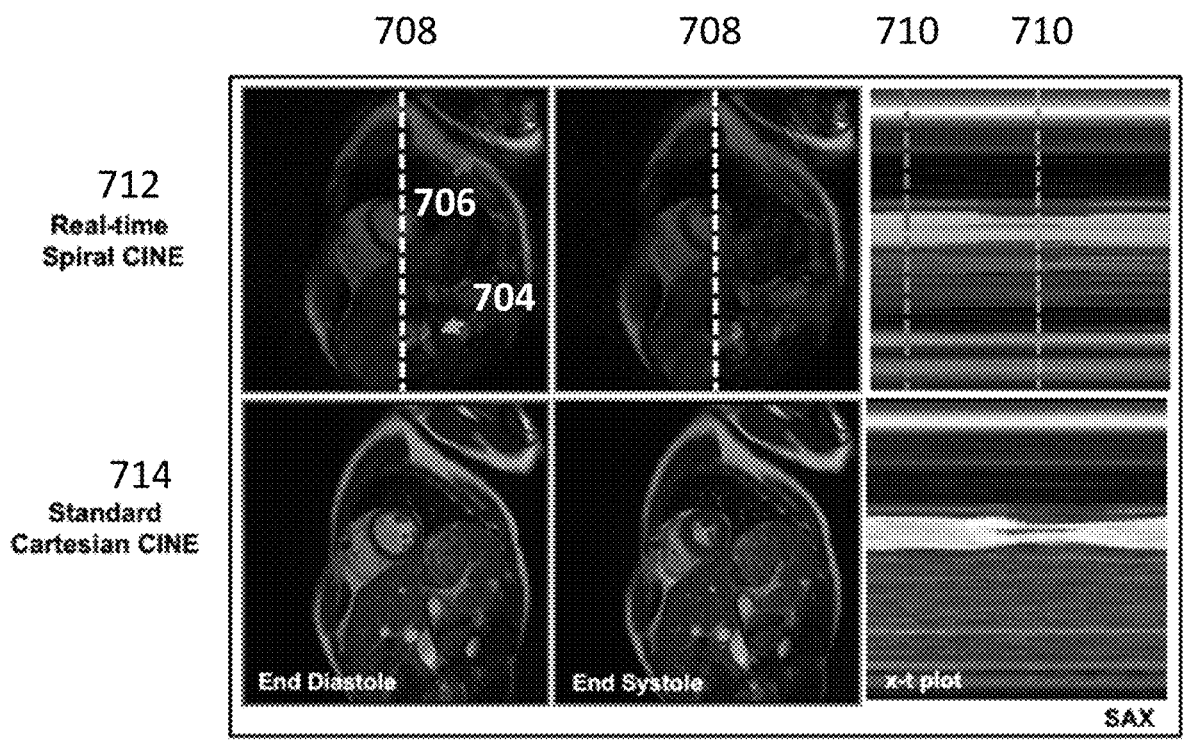
FIGS. 7A-7B illustrate single slice comparison between the real-time, free-breathing spiral CINE and the standard breath-held CINE.
Figure 7B:
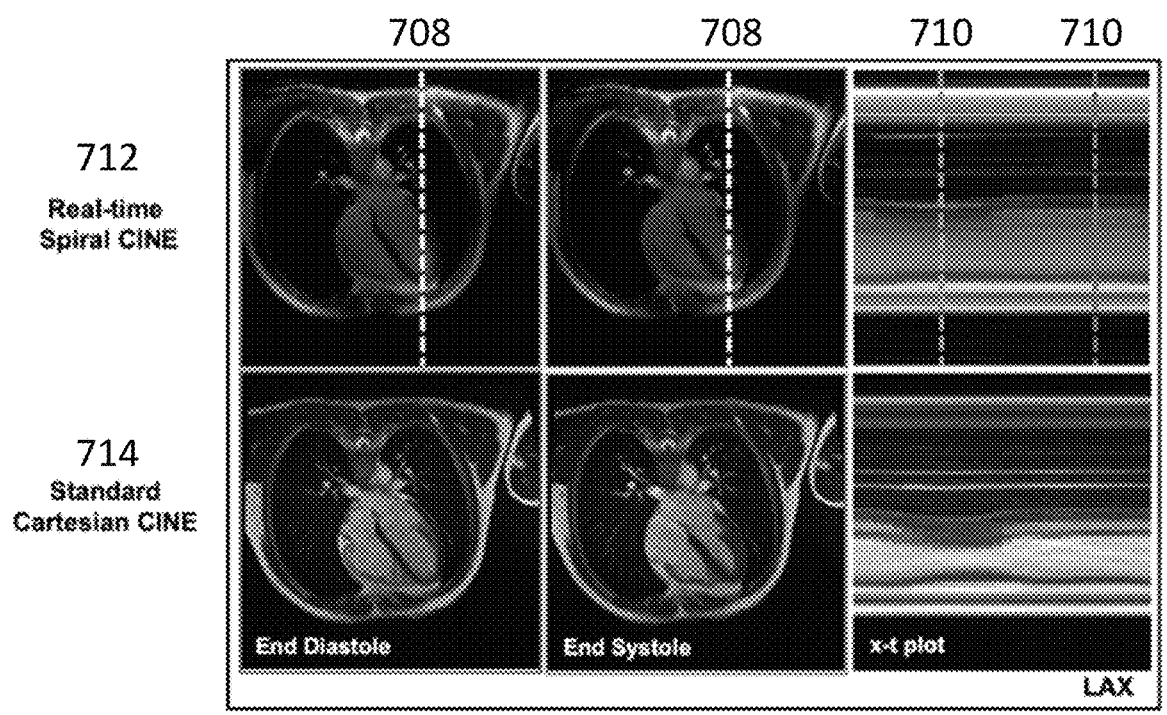

FIGS. 7A-7B show systolic and diastolic frames from the free-breathing spiral-in-out bSSFP sequence combined with L+S in the top row 712, and from the standard breath-held Cartesian bSSFP cine sequence in the bottom row 714. FIG. 7A shows illustrations of the short axis, and FIG. 7B shows illustrations from the long axis. The x-t plots indicate that the experimental embodiment of the present disclosure yields a relatively smooth transition between the end of systole and the end of diastole, when compared with the standard method. In the example results illustrated in FIGS. 6A-7B, B0 inhomogeneity-induced artifacts such as banding and blurring can be not evident at 0.55 T after good cardiac shimming. Lengthening the TR to 6.5 ms or more may lead to an increase in pulsatile flow artifacts, especially in slices where the aortic pulsation is strong.

In the examples shown in FIG. 7A-7B, the white dashed lines 708 indicate the location used to derive the x-t profile. A set of dashed lines 710 indicate end systolic and end diastolic cardiac images, respectively. An arrow 704 points to structures showing flow artifacts, and a second arrow 706 points to structures showing banding artifacts. The present disclosure also contemplates that visual assessment and quantitative functional measures such as LV ejection fraction in comparison to Cartesian cine can be used in some embodiments of the present disclosure.

In this example, a non-limiting example embodiment including a high-resolution real-time spiral-in-out bSSFP cine sequence tested at 0.55 T. By taking advantage of better B0 homogeneity, the results show that the proposed method can recover SNR and achieve diagnostic image quality at low field through high-efficiency spiral sampling and CS-based image reconstruction.

EXAMPLE 2

Spiral-in-out bSSFP Real-Time Cine on a High Performance 0.55 T Scanner

Figure 9B:
FIG. 9A-9B illustrate MRI images.
Figure 9A:
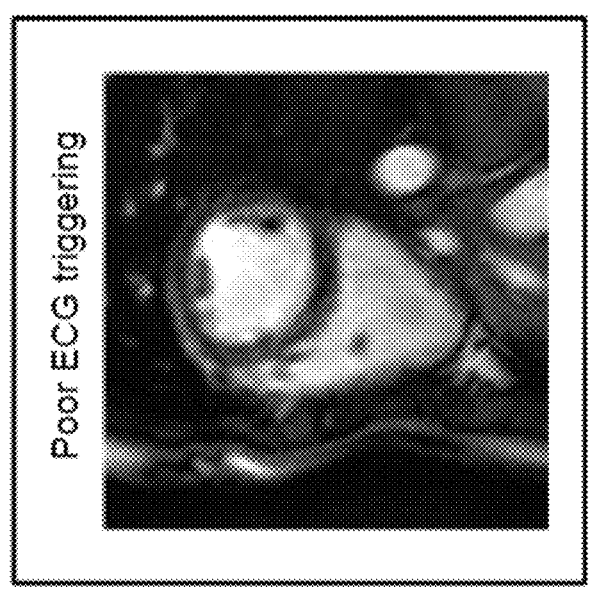

Cardiac MRI CINE imaging can use ECG triggering during breath-holding. This can require good ECG trigger signals, which can lead to mis-gating (e.g. arrhythmia, ECG distortion). Additionally this can require ~10-15 s per breath-held, which can cause motion artifacts, and can require ~12 min to cover the whole heart, which can reduce patient comfort. The artifacts and issues associated with breath holding can impact the quality of the resulting MRI images. FIGS. 9A-9B show examples of poor ECG triggering, poor breath hold, and a successful breath hold. FIG. 9A illustrates an example of poor ECG triggering, FIG. 9B illustrates a comparison of a poor breath hold with a successful breath hold.

Figure 10:
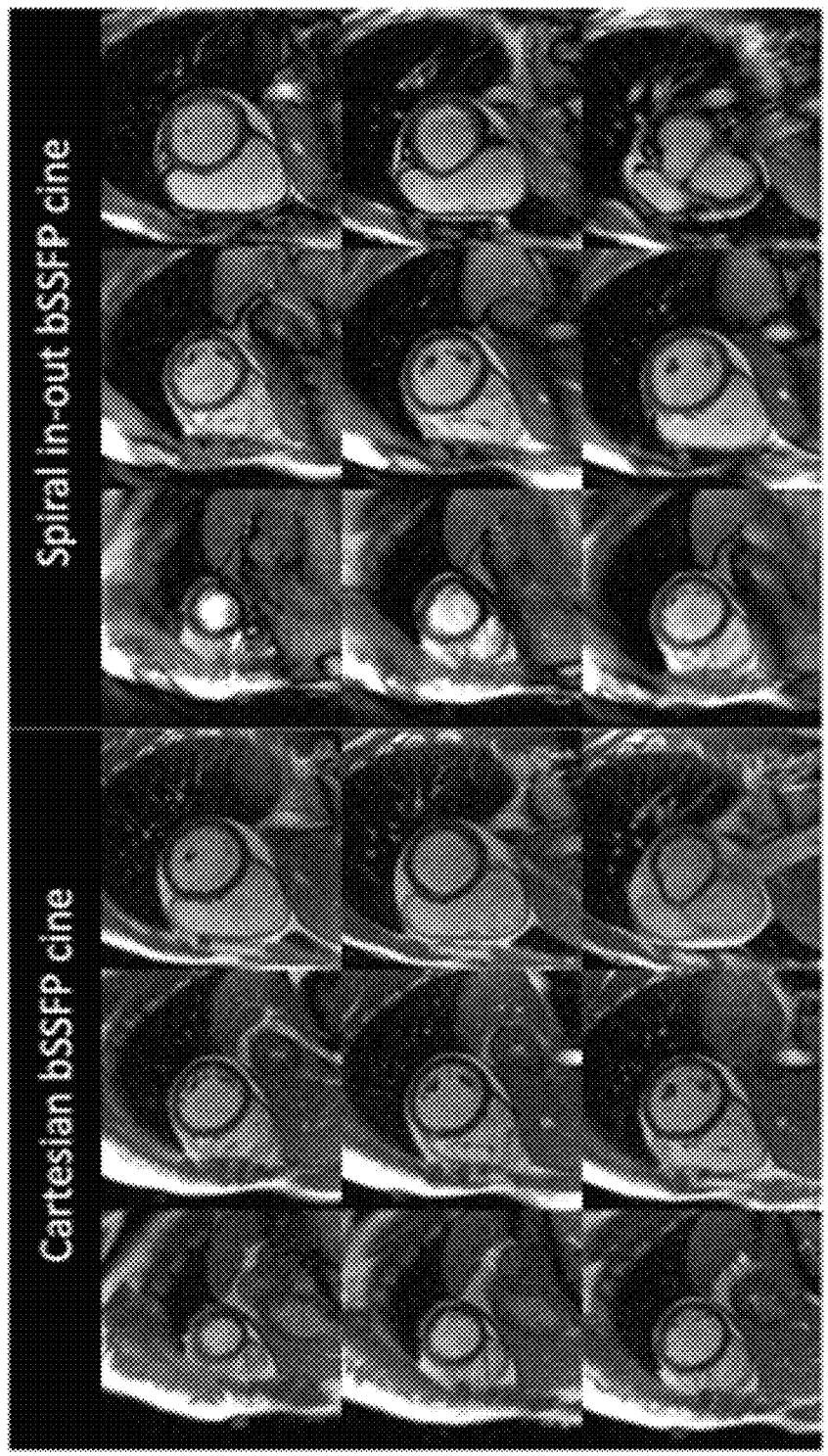
FIG. 10 illustrates a comparison of Cartesian bSSFP cine with spiral in-out BSSFP cine.

Embodiments of the present disclosure including low-field (0.55 T) can offer opportunities for cardiac MRI imaging [4, 5]. Benefits that can be realized in embodiments of the present disclosure include shorter T1 & longer T2*, improved B0 homogeneity, which can reduce banding artifacts in bSSFP, and reduced RF power limits (higher flip angles). These advantages can allow for embodiments of the present disclosure including imaging at low field favors SNR-efficient acquisitions with longer readouts such as spiral and EPI trajectories to mitigate the SNR loss at low field. A comparison of Cartesian bSSFP cine with spiral in-out BSSFP cine is illustrated in FIG. 10.

Figure 11:
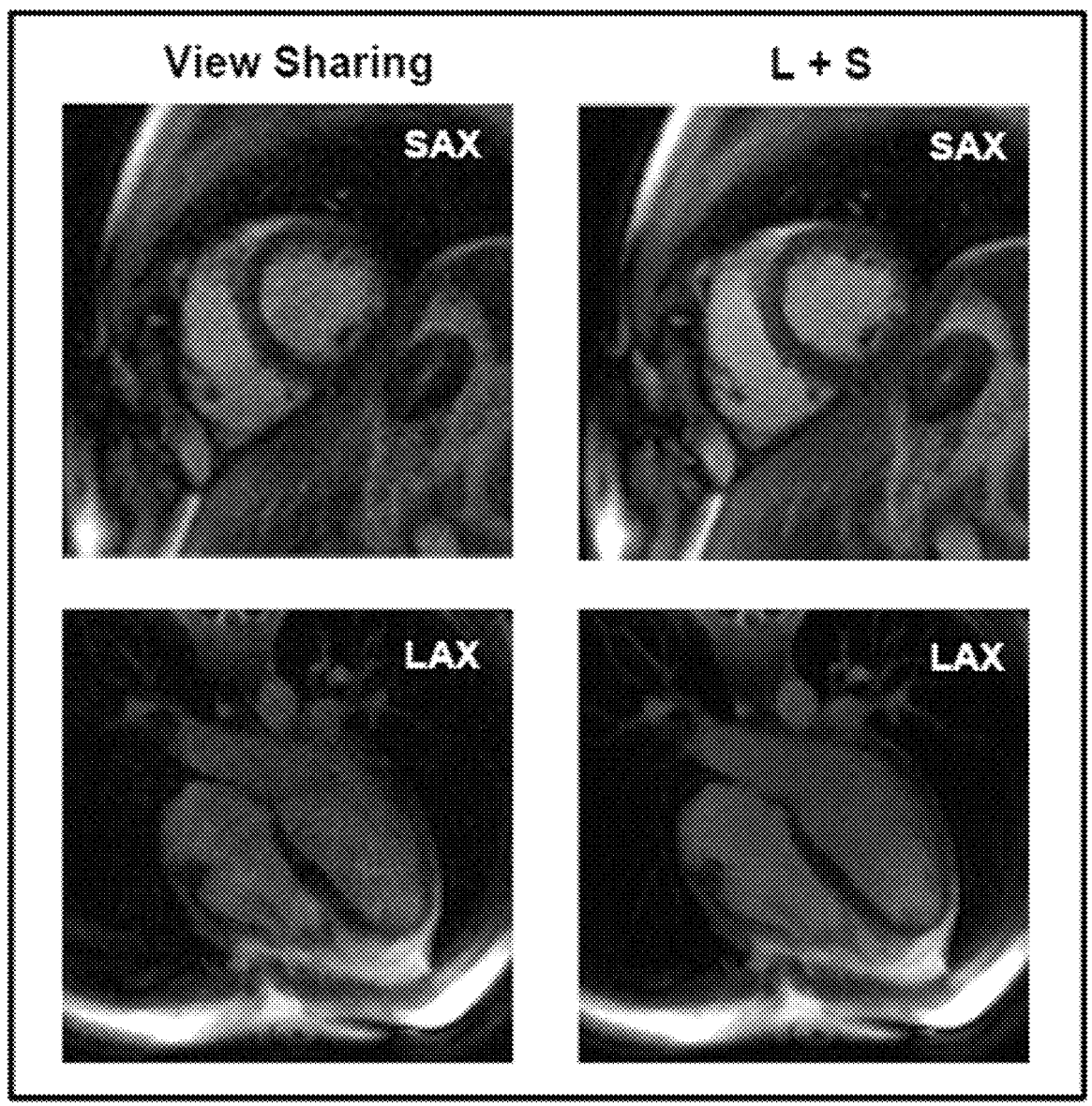
FIG. 11 illustrates an example of Breath-held RT spiral-in-out CINE using view-sharing vs. L+S reconstruction.
Figure 12:
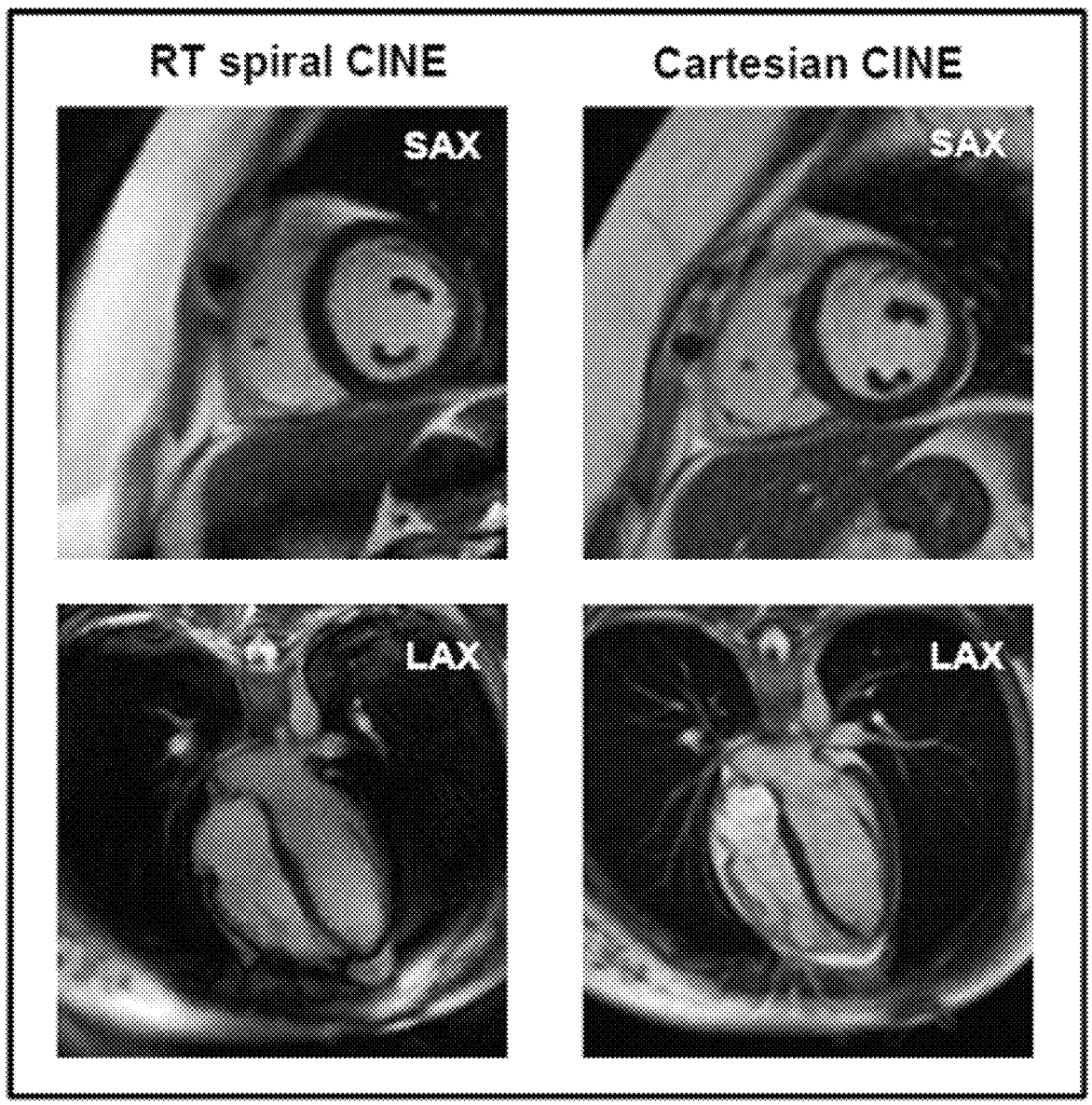
FIG. 12 illustrates a comparison of free-breathing RT spiral CINE vs. standard Cartesian CINE.

FIG. 11 illustrates an example of breath-held RT spiral-in-out CINE using view sharing vs. L+S reconstruction, according to another example embodiment of the present disclosure. FIG. 12 illustrates results from another example embodiment where a free-breathing RT spiral CINE is compared to a Cartesian CINE.

The results from the example embodiment show that ungated real-time CINE using spiral-in-out bSSFP sequence with a longer readout at 0.55 T scanner can achieve high temporal resolution (~36 ms) and spatial resolution (~1.7× 1.7 mm2) within three seconds per slice. Embodiments of the present disclosure can take advantage of better B0 homogeneity. For example, the example embodiment method can recover SNR and achieve diagnostic image quality through high-efficient spiral sampling and CS-based image reconstruction. Additionally, lengthening TR to 6.5 ms or more may lead to an increase in pulsatile flow artifacts It should be understood that embodiments of the present disclosure can include visual assessment and quantitative functional measures in comparison to Cartesian CINE, e.g. left ventricular ejection fraction

CONCLUSION

The specific configurations, choice of materials and the size and shape of various elements can be varied according to particular design specifications or constraints requiring a system or method constructed according to the principles of the present disclosure. Such changes are intended to be embraced within the scope of the present disclosure. The presently disclosed embodiments, therefore, are considered in all respects to be illustrative and not restrictive. The patentable scope of certain embodiments of the present disclosure is indicated by the appended claims, rather than the foregoing description.

LIST OF REFERENCES

All references cited in this disclosure are incorporated by references as if set forth in full herein.

[1] Carr J C, Simonetti O, Bundy J, Li D, Pereles S, Finn J P. Cine MR angiography of the heart with segmented true fast imaging with steady-state precession. Radiology 2001; 219:828-834.

[2] Simonetti O P. Ahmad R. Low-Field Cardiac Magnetic Resonance Imaging: A Compelling Case for Cardiac Magnetic Resonance's Future. Circulation, Cardiovascular Imaging. 2017; 10(6).

[3] Rashid S. Han F. Gao Y. Sung K. Cao M. Yang Y. Hu P. Cardiac Balanced steady-state free precession MRI at 0.35 T: a comparison study with 1.5 T. Quantitative Imaging in Medicine and Surgery. 2017; 8(7):627-636.

[4] Campbell-Washburn, A. E. et al, Opportunities in interventional and diagnostic imaging using high-performance low field MRI. Radiology, 2019; 293: 384-393.

[5] Restivo M C, Ramasawmy R, Bandettini W P, Herzka D A, Campbell-Washburn A E. Efficient spiral in-out and EPI balanced steady-state free precession cine imaging using a high-performance 0.55 T MRI. Magn Reson Med. 2020; 84:2364-2375.

[6] Feng X, Salerno M, Kramer C M, Meyer C H. Non-Cartesian balanced steady-state free precession pulse sequences for real-time cardiac MRI. Magn Reson Med. 2016, 75(4):1546.

[7] Wang Z, Feng X, Dou Q, Meyer C H. Accelerated Spiral imaging for Real-time Cardiac MRI. Proceedings 26th Annual Meeting ISMRM, Paris. 2018:0935.

[8] Otazo R, Candes E, Sodickson D K. Low-rank plus sparse matrix decomposition for accelerated dynamic MRI with separation of background and dynamic components. Magn Reson Med. 2014. 73(3): 1125-1136.

[9] Uecker M, Lai P, Mruphy M J, et al. ESPIRiT—an eigenvalue approach to auto-calibrating parallel MRI: where SENSE meets GRAPPA. Magn Reson Med. 2014. 71(3): 990-1001.

[10] Fessler J A. On NUFFT-based gridding for non-Cartesian MRI. J Magn Reson. 2007; 188:191-195.

The invention claimed is:

1. A computer implemented method for ungated magnetic resonance imaging, comprising:
producing magnetic resonance imaging (MRI) data corresponding to a target by scanning the target in a low magnetic field with a pulse sequence having a spiral trajectory;
sampling k-space data from respective scans in the low magnetic field and receiving at least one field map data acquisition and a series of MRI data acquisitions from the respective scans;
forming a field map and at least one sensitivity map in image space from the field map data acquisition;
forming target k-space data with the series of MRI data acquisitions with a Non-Uniform Fast Fourier Transform;
forming initial magnetic resonance images in the image domain by applying a gridding operation to the target k-space data; and
forming reconstructed images with a low rank plus sparse (L+S) reconstruction algorithm applied to the initial magnetic resonance images.

2. The computer implemented method of claim 1, wherein sampling k-space data comprises sampling a continuous series of the respective scans, each scan having the at least one field map data acquisition and the series of MRI data acquisitions.

3. The computer implemented method of claim 1, wherein the respective scans comprise two field map data acquisitions that are used to form the field map and multiple sensitivity maps in image space.

4. The computer implemented method of claim 1, wherein the respective scans further comprise dummy cycles, with a data acquisition window in an off state, to achieve a steady state of magnetization before implementing the MRI data acquisitions with the acquisition window in an on state.

5. The computer implemented method of claim 4, wherein the respective scans comprise 100 dummy cycles.

6. The computer implemented method of claim 5, wherein the dummy cycles occur after the field data acquisition.

7. The computer implemented method of claim 1, wherein the respective scans with the series of MRI data acquisitions comprise 384 spiral arms per slice.

8. The computer implemented method of claim 7, wherein the target is a heart of a patient and the respective scans cover a heart cycle.

9. The computer implemented method of claim 7, wherein the respective scans utilize a tiny golden angle rotation along the time domain to reduce the eddy current effect when alternating the gradient polarity.

10. The computer implemented method of claim 1, wherein the series of MRI data acquisitions comprise a variable density spiral-in-out trajectory scan.

11. The computer implemented method of claim 10, wherein the variable density spiral-in-out scan comprises a 4 ms readout length to sample a frame of the target k-space data at positions proximate a center of the frame.

12. The computer implemented method of claim 11, wherein the variable density spiral-in-out scan reduces coherence of under-sampling aliasing patterns to improve characteristics for the L+S reconstruction algorithm.

13. The computer implemented method of claim 1, wherein the reconstructed images comprise corrections for blurring artifacts and aliasing artifacts by modifying the initial images in accordance with the field map, the sensitivity map and the L+S algorithm.

14. The computer implemented method of claim 1, wherein the low magnetic field strength is less than 1 Tesla.

15. The computer implemented method of claim 1 wherein the low magnetic field is 0.55 Tesla.

16. The computer implemented method of claim 1, further comprising utilizing balanced steady state free precession (bSSFP) sequences in the cardiac imaging.

17. The computer implemented method of claim 1, further comprising under-sampling target k-space data using a spiral-in-out trajectory.

18. The computer implemented method of claim 17, further comprising under-sampling by a factor of 8.

19. A system for ungated magnetic resonance imaging, comprising:
a magnetic resonance imaging device configured to produce magnetic resonance imaging (MRI) data corresponding to a target; and
one or more processors in data communication with computer memory and the magnetic resonance imaging device, wherein the one or more processors are configured to cause the system to perform a computer implemented method comprising:
scanning the target in a low magnetic field with a pulse sequence having a spiral trajectory;
sampling k-space data from respective scans in the low magnetic field and receiving at least one field map data acquisition and a series of MRI data acquisitions from the respective scans;
forming a field map and multiple sensitivity maps in image space from the field map data acquisition;
forming target k-space data with the series of MRI data acquisitions;
forming initial magnetic resonance images in the image domain by applying a Non-Uniform Fast Fourier Transform and gridding the target k-space data; and
forming reconstructed images with a low rank plus sparse (L+S) reconstruction algorithm applied to the initial magnetic resonance images.

20. A non-transitory computer-readable medium having stored instructions that, when executed by one or more processors, cause a magnetic resonance imaging system to perform a computer implemented method that comprises:

scanning a target in a low magnetic field with a pulse sequence having a spiral trajectory;

sampling k-space data from respective scans in the low magnetic field and receiving at least one field map data acquisition and a series of MRI data acquisitions from the respective scans;

forming a field map and multiple sensitivity maps in image space from the field map data acquisition;

forming target k-space data with the series of MRI data acquisitions;

forming initial magnetic resonance images in the image domain by applying a Non-Uniform Fast Fourier Transform and gridding the target k-space data; and forming reconstructed images with a low rank plus sparse (L+S) reconstruction algorithm applied to the initial magnetic resonance images.

\* \* \* \* \*